United States Patent [19]
Furuya

[11] Patent Number: 5,874,858
[45] Date of Patent: Feb. 23, 1999

[54] AMPLIFIER SYSTEM HAVING A CONSTANT CURRENT REGULATING UNIT

[75] Inventor: Misao Furuya, Atsugi, Japan

[73] Assignee: Mitsumi Electric Company, Ltd., Tokyo, Japan

[21] Appl. No.: 823,695

[22] Filed: Mar. 25, 1997

[30] Foreign Application Priority Data

Mar. 26, 1996 [JP] Japan ................................. 8-070574

[51] Int. Cl.$^6$ ........................................................ H03F 3/30
[52] U.S. Cl. ............................................. 330/273; 330/262
[58] Field of Search ................................ 330/70, 71, 262, 330/271, 273, 291, 293, 310, 311

[56] References Cited

U.S. PATENT DOCUMENTS 3,701,032 10/1972 Steckler .................................. 330/291
4,573,021 2/1986 Widler .................................... 330/273

FOREIGN PATENT DOCUMENTS 406244658 9/1994 Japan ..................................... 330/273

OTHER PUBLICATIONS

Oswald, "Class B Emitter–Follower", IBM Technical Disclosure Bulletin, vol. 8, No. 10, Mar. 1966.

Primary Examiner—James B. Mullins
Attorney, Agent, or Firm—Michael N. Meller

[57] ABSTRACT

An amplifier system includes a constant current unit which produces a constant current in response to a source voltage from a source voltage terminal. An emitter follower unit has a base, an emitter and a collector, an input signal being supplied to the base, the emitter being connected to the constant current unit, the source voltage being supplied to the collector, the emitter follower unit producing an output signal at the emitter in response to the input signal. A current regulating unit regulates the constant current in response to a collector current fed into the collector of the emitter follower unit, so that the constant current is fed from the emitter of the emitter follower unit into the constant current unit.

6 Claims, 6 Drawing Sheets

FIG. 6

AMPLIFIER SYSTEM HAVING A CONSTANT CURRENT REGULATING UNIT

BACKGROUND OF THE INVENTION (1) Field of the Invention

The present invention generally relates to an amplifier system, and more particularly to an improvement of an amplifier system including an emitter follower unit and a constant current unit, the constant current unit producing a constant current being fed from the emitter follower unit.

(2) Description of the Related Art

An amplifier system, such as a buffer amplifier system, is installed into a semiconductor device for use. Recently, there is an increasing demand for a semiconductor device which operates with a low voltage level and a small power consumption. Therefore, it is desirable to provide an amplifier system which can be driven with a low voltage level and a small current consumption, for use in the semiconductor device.

Figure 1:
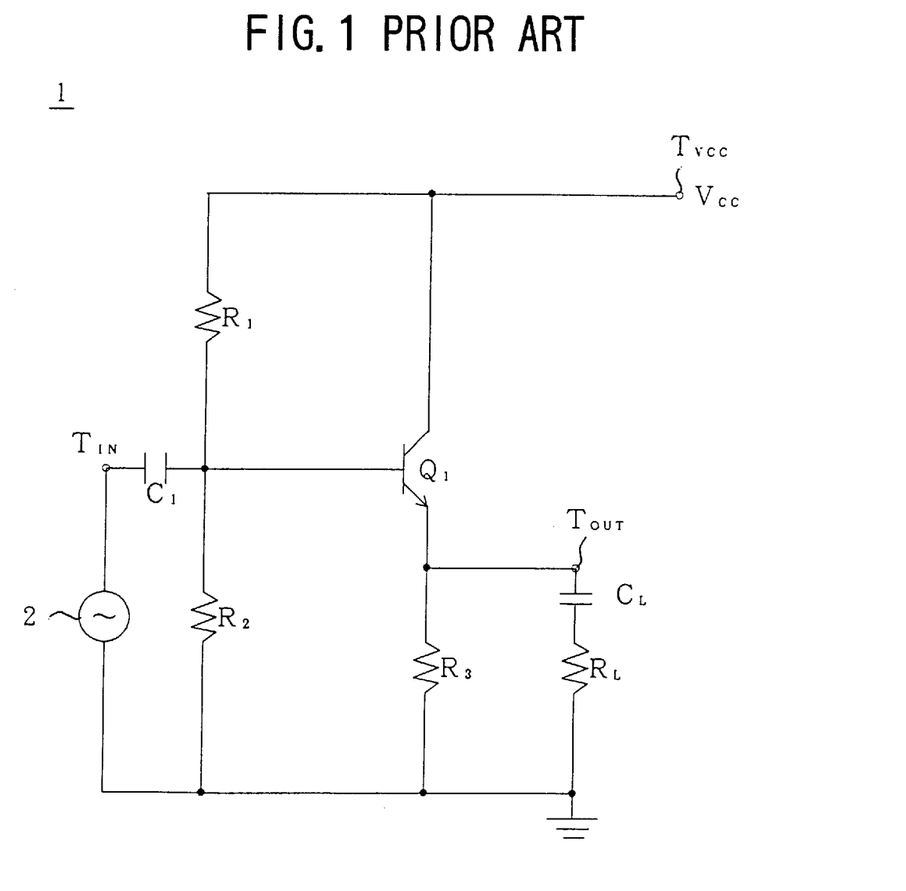
FIG. 1 is a circuit diagram of an example of a conventional buffer amplifier system.

FIG. 1 shows an example of a conventional buffer amplifier system. As shown in FIG. 1, the conventional buffer amplifier system 1 comprises a capacitor C1, a resistor R1, a resistor R2, a resistor R3, and an NPN transistor Q1.

The conventional buffer amplifier system 1 has an input terminal Tin to which an input signal from a signal source 2 is supplied, a source voltage terminal Tvcc to which a source voltage Vcc from a source voltage supply (not shown) is supplied, and an output terminal Tout to which an output signal from the NPN transistor Q1 is supplied. The NPN transistor Q1 has a base connected to the input terminal Tin, a collector connected to the source voltage terminal Tvcc, and an emitter connected to the output terminal Tout. As shown, the above-mentioned elements constitute an emitter follower unit.

The capacitor C1 is connected at one end to the input terminal Tin and connected at the other end to the base of the NPN transistor Q1. The capacitor C1 removes a DC (direct current) component of the input signal which the signal source 2 supplies, and the input signal from the capacitor C1 is supplied to the base of the NPN transistor Q1.

The resistor R1 is connected at one end to the base of the NPN transistor Q1 and connected at the other end to the source voltage terminal Tvcc. The source voltage Vcc from the source voltage terminal Tvcc is supplied to the buffer amplifier system 1, as shown in FIG. 1. The resistor R2 is connected at one end to the base of the NPN transistor Q1, and the other end of the resistor R2 is grounded. The resistors R1 and R2 are connected to each other at a connection point where the capacitor C1 and the base of the NPN transistor Q1 are connected. The source voltage Vcc is supplied to the resistor R1, and the resistors R1 and R2 serve as a voltage divider of the source voltage Vcc. Thus, a bias voltage is produced at the connection point by the resistors R1 and R2.

Since the input terminal Tin is connected to the connection point between the resistors R1 and R2 via the capacitor C1, the input signal from the capacitor C1 is biased by the bias voltage at the connection point, and the resulting input signal is supplied to the base of the NPN transistor Q1.

In the NPN transistor Q1, the base is connected to the input terminal Tin via the capacitor C1, the collector is connected to the source voltage terminal Tvcc, and the emitter is connected to the output terminal Tout. Also, the emitter of the NPN transistor Q1 is grounded via the resistor R3. The resistor R3 is a load resistor, and a constant current is fed from the emitter of the NPN transistor Q1 into the resistor R3.

The NPN transistor Q1 produces the output signal at the emitter in response to the input signal at the base, and an emitter current (or the constant current mentioned above) is fed from the emitter into the resistor R3. The output terminal Tout to which the output signal from the NPN transistor Q1 is supplied is connected to a connection point at which the resistor R3 and the emitter of the NPN transistor Q1 are connected to each other.

In the NPN transistor Q1, an emitter current, the amount of which is, for example, "k" times as large as the amount of a base current fed into the base, is fed from the emitter. "k" is called a ratio of current amplification of the buffer amplifier system. The NPN transistor Q1 supplies an output signal, produced at the emitter in accordance with the emitter current, to the output terminal Tout.

When the input signal supplied to the NPN transistor Q1 is increased, the emitter current is increased so that the level of the output signal from the NPN transistor Q1 ascends. On the other hand, when the input signal is decreased, the emitter current is decreased so that the level of the output signal descends.

In the buffer amplifier system 1 of FIG. 1, a capacitor CL is connected at one end to the output terminal Tout and connected at the other end to a load resistor RL. The capacitor CL removes a DC component of the output signal supplied to the output terminal Tout, and a current in accordance with the output signal is fed into the load resistor RL.

Figure 2:
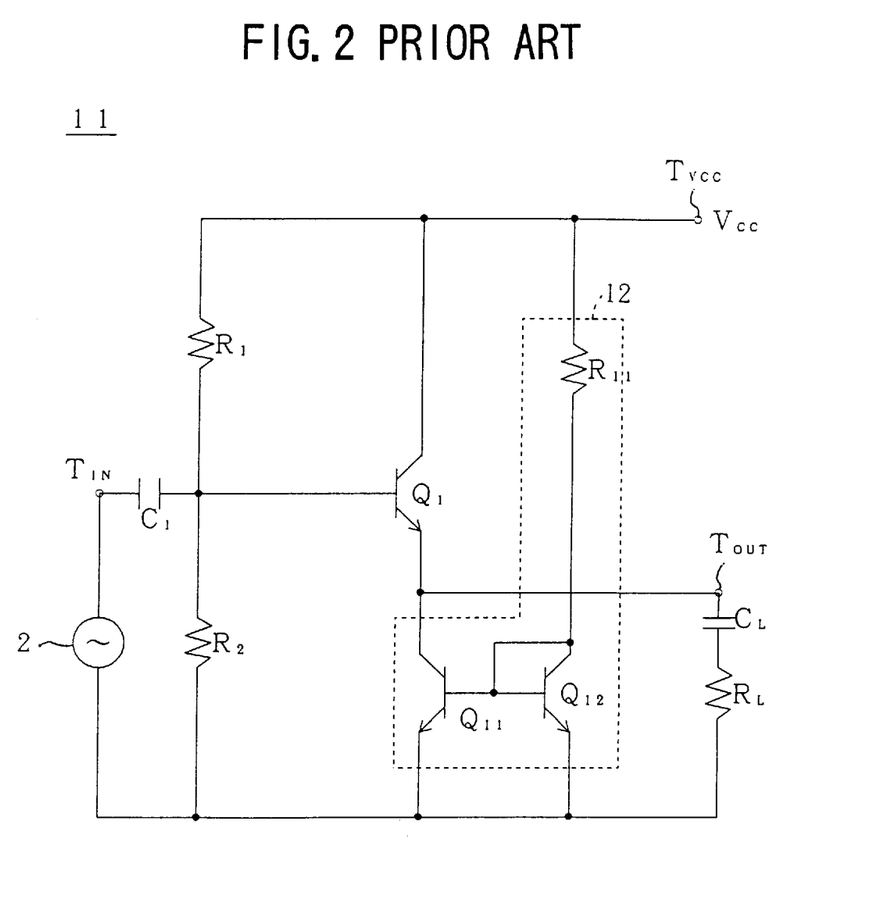
FIG. 2 is a circuit diagram of another example of the conventional buffer amplifier system.

FIG. 2 shows another example of the conventional buffer amplifier system. In FIG. 2, the elements which are the same as corresponding elements in FIG. 1 are designated by the same reference numerals, and a description thereof will be omitted.

As shown in FIG. 2, the conventional buffer amplifier system 11 comprises the capacitor C1, the resistor R1, the resistor R2, the NPN transistor Q1, and a current mirror unit 12.

The current mirror unit 12 is a constant current unit which produces a constant current in response to the source voltage Vcc, the constant current being fed from the emitter of the NPN transistor Q1 into the current mirror unit 12. The current mirror unit 12 of FIG. 2 can produce the constant current with a high level of accuracy.

The current mirror unit 12 comprises an NPN transistor Q11, an NPN transistor Q12, and a resistor R11. The NPN transistor Q11 has a collector which is connected to the emitter of the NPN transistor Q1, an emitter which is grounded, and a base which is connected to a base of the NPN transistor Q12.

The NPN transistor Q12 has a collector which is connected to the source voltage terminal Tvcc via the resistor R11, the base which is connected to the base of the NPN transistor Q11, and an emitter which is grounded. The NPN transistor Q12 has the base and the collector which are connected to each other by a connecting wire, and the NPN transistor Q12 forms a diode. The collector of the NPN transistor Q12 and the base of the NPN transistor Q12 are set at the same voltage level by the connecting wire.

In the current mirror unit 12, the source voltage Vcc is supplied to the resistor R11, and the emitters of the NPN transistors Q11 and Q12 are grounded. A base current is fed into the base of the NPN transistor Q12. The NPN transistor Q12 is driven by the base current, and a collector current is fed into the collector of the NPN transistor Q12. Since the base of the NPN transistor Q11 is connected to the base of the NPN transistor Q12, a constant current which is the same as the collector current of the NPN transistor Q12 is fed from the emitter of the NPN transistor Q1 into the collector of the NPN transistor Q11.

Accordingly, the current mirror unit 12 produces a constant current in response to the source voltage Vcc from the source voltage terminal Tvcc, the constant current being fed from the emitter of the NPN transistor Q1 into the collector of the NPN transistor Q11. By using the current mirror unit 12, it is possible to make stable the flow of the constant current fed from the emitter of the NPN transistor Q1 into the current mirror unit 12. Thus, the conventional buffer amplifier system 11 of FIG. 2 can amplify the input signal into the output signal with a high level of accuracy.

Figure 3:
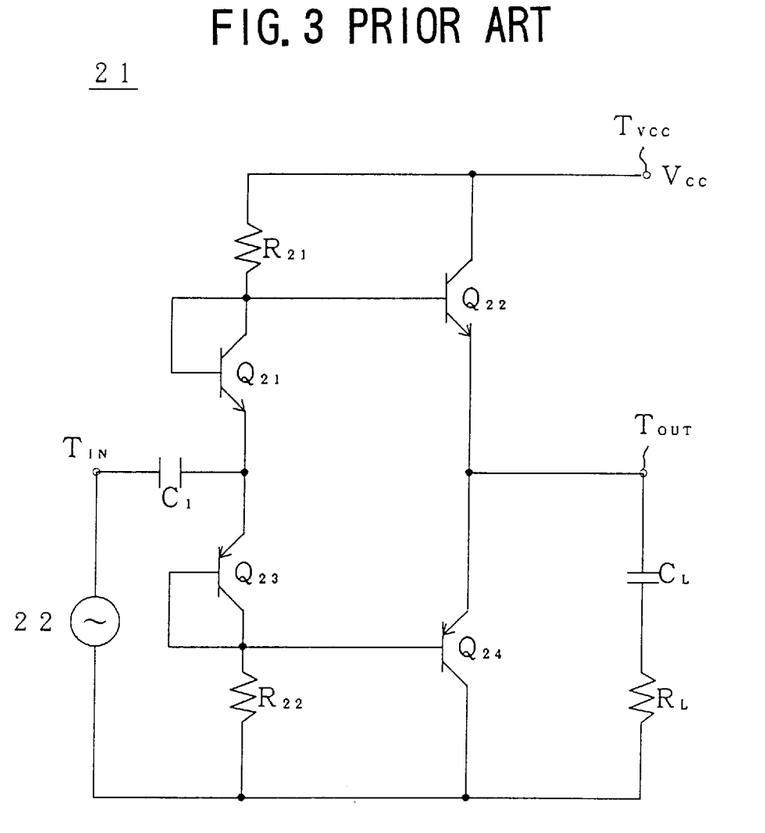
FIG. 3 is a circuit diagram of a further example of the conventional buffer amplifier system.

FIG. 3 shows a further example of the conventional buffer amplifier system. In FIG. 3, the elements which are the same as corresponding elements in FIG. 1 are designated by the same reference numerals, and a description thereof will be omitted.

As shown in FIG. 3, the conventional buffer amplifier system 21 comprises the capacitor C1, an NPN transistor Q21, an NPN transistor Q22, a PNP transistor Q23, a PNP transistor Q24, a resistor R21, and a resistor R22.

The conventional buffer amplifier system 21 has the input terminal Tin to which an input signal from a signal source 22 is supplied, and the source voltage terminal Tvcc to which a source voltage Vcc from a source voltage supply (not shown) is supplied.

The capacitor C1 is connected at one end to the input terminal Tin and connected at the other end to an emitter of the NPN transistor Q21 and an emitter of the PNP transistor Q23. The NPN transistor Q21 has a base and a collector which are connected to each other by a connecting wire, and the NPN transistor Q21 forms a diode. In the NPN transistor Q21, the base and the collector are connected to the source voltage terminal Tvcc via the resistor R21, and the emitter is connected to the input terminal Tin via the capacitor C1.

The PNP transistor Q23 has a base and a collector which are connected to each other by a connecting wire, and the PNP transistor Q23 forms a diode. In the PNP transistor Q23, the emitter is connected to the input terminal Tin via the capacitor C1, and the base and the collector are grounded via the resistor R22.

The source voltage Vcc is supplied to the resistor R21, and the resistor R22 is grounded. The resistor R21, the NPN transistor Q21, the PNP transistor Q22 and the resistor R22 are connected in series. The NPN transistor Q21 produces a first intermediate voltage at a connection point between the resistor R21 and the NPN transistor Q21 from the voltage of the input signal, the first intermediate voltage being biased in the forward direction from the center voltage of the input signal. The PNP transistor Q22 produces a second intermediate voltage at a connection point between the PNP transistor Q22 and the resistor R22 from the voltage of the input signal, the second intermediate voltage being biased in the reverse direction from the center voltage of the input signal.

The first intermediate voltage at the connection point between the resistor R21 and the NPN transistor Q21 is supplied to the base of the NPN transistor Q22. Also, the second intermediate voltage at the connection point between the PNP transistor Q23 and the resistor R22 is supplied to the base of the PNP transistor Q24.

The NPN transistor Q22 has a collector which is connected to the source voltage terminal Tvcc, and an emitter which is connected to the output terminal Tout. The first intermediate voltage biased in the forward direction from the center voltage of the input signal is supplied to the base of the NPN transistor Q22, and the NPN transistor Q22 produces an output signal at the emitter. The output signal from the emitter of the NPN transistor Q22 is supplied to the output terminal Tout.

The PNP transistor Q24 has a collector which is grounded, and an emitter which is connected to the output terminal Tout. The second intermediate voltage biased in the reverse direction from the center voltage of the input signal is supplied to the base of the PNP transistor Q24, and the PNP transistor Q24 produces an output signal at the emitter, the output signal being the same as that at the emitter of the NPN transistor Q22.

The conventional buffer amplifier system of FIG. 3 is called a single-end push-pull amplifier circuit. The voltage of the input signal is amplified into the positive side and the negative side of the center voltage of the input signal separately. The conventional buffer amplifier system of FIG. 3 can produce an adequately high level of the output signal from the input signal.

However, when the above-described buffer amplifier systems of FIGS.1, 2 and 3 are used with a low voltage level and a small current consumption, the output signal produced by these systems will be at a too low level. It is difficult to avoid the lowering of the level of the output signal when the above-described amplifier systems are used.

SUMMARY OF THE INVENTION

An object of the present invention is to provide an improved amplifier system in which the above-described problems are eliminated.

Another object of the present invention is to provide an amplifier system which produces an adequately high level of the output signal from the input signal when operating with a low voltage level and a small current consumption.

The above-mentioned objects of the present invention are achieved by an amplifier system which comprises: a constant current unit which produces a constant current in response to a source voltage from a source voltage terminal; an emitter follower unit having a base, an emitter and a collector, an input signal being supplied to the base, the emitter being connected to the constant current unit, the source voltage being supplied to the collector, the emitter follower unit producing an output signal at the emitter in response to the input signal; and a current regulating unit which regulates the constant current in response to a collector current fed into the collector of the emitter follower unit, so that the constant current is fed from the emitter of the emitter follower unit into the constant current unit.

In the amplifier system of the present invention, the current regulating unit regulates the constant current, produced by the constant current unit, in response to the collector current fed into the collector of the emitter follower unit, and the constant current is fed from the emitter of the emitter follower unit into the constant current unit. The current regulating unit regulates the constant current in response to the collector current the phase of which is reverse to the phase of the input signal. It is possible that the drive capability of the emitter follower unit be increased with a small current consumption.

BRIEF DESCRIPTION OF THE DRAWINGS

The above and other objects, features and advantages of the present invention will become more apparent from the following detailed description when read in conjunction with the accompanying drawings in which.

DETAILED DESCRIPTION OF THE PREFERRED EMBODIMENT

A description will now be given of the preferred embodiment of the present invention with reference to the accompanying drawings.

Figure 4:
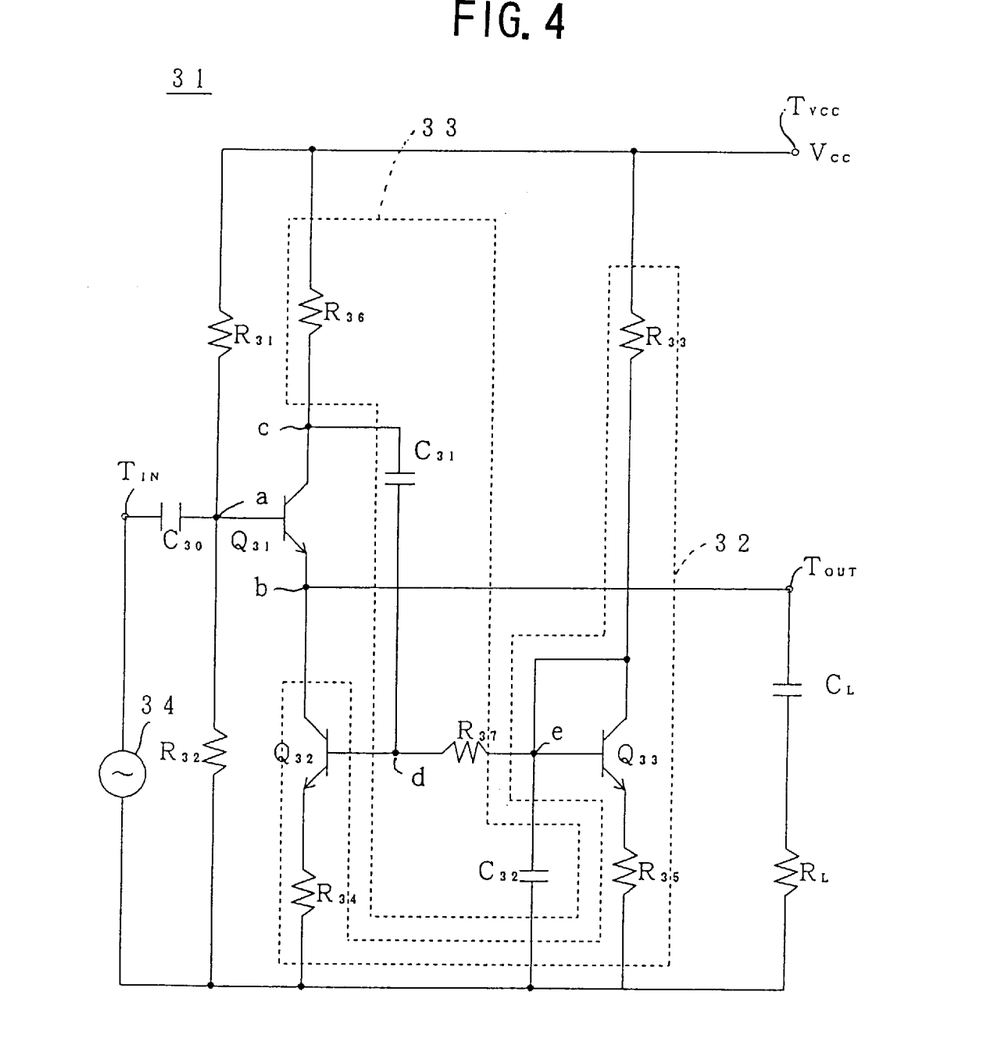
FIG. 4 is a circuit diagram of a buffer amplifier system in one embodiment of the present invention.

FIG. 4 shows a buffer amplifier system in one embodiment of the present invention.

As shown in FIG. 4, a buffer amplifier system 31 comprises a capacitor C30, a resistor R31, a resistor R32, an NPN transistor Q31, a constant current unit 32, and a current regulating unit 33.

The buffer amplifier system 31 has an input terminal Tin to which a signal source 34 supplies an input signal, and a source voltage terminal Tvcc to which a source voltage Vcc is supplied. The NPN transistor Q31 has a base, a collector and an emitter. The base of the NPN transistor Q31 is connected to the input terminal Tin via the capacitor C30. The collector of the NPN transistor Q31 is connected to the source voltage terminal Tvcc via the current regulating unit 33. The above-mentioned elements constitute an emitter follower unit of the buffer amplifier system 31.

The capacitor C30 is connected at one end to the input terminal Tin and connected at the other end to the base of the NPN transistor Q31. The capacitor C30 and the base of the NPN transistor Q31 are connected to each other at a connection point "a". The capacitor C30 removes a DC (direct current) component of the input signal which the signal source 34 supplies, and the input signal from the capacitor C30 is supplied to the NPN transistor Q31.

The resistor R31 is connected at one end to the base of the NPN transistor Q31 and connected at the other end to the source voltage terminal Tvcc. The source voltage Vcc from the source voltage terminal Tvcc is supplied to the buffer amplifier system 31, as shown in FIG. 4. The resistor R32 is connected at one end to the base of the NPN transistor Q31, and the other end of the resistor R32 is grounded. The resistors R31 and R32 are connected to each other at the connection point "a". The source voltage Vcc is supplied to the resistor R31, and the resistors R31 and R32 serve as a voltage divider of the source voltage Vcc. Thus, a bias voltage is produced at the connection point "a" by the resistors R31 and R32.

Since the input terminal Tin is connected to the connection point "a" via the capacitor C30, the input signal from the capacitor C30 is biased by the bias voltage at the connection point "a", and the resulting input signal is supplied to the base of the NPN transistor Q31.

In the NPN transistor Q31, the base is connected to the input terminal Tin, the collector is connected to the source voltage terminal Tvcc, and the emitter is connected to the constant current unit 32 at a connection point "b".

The constant current unit 32 constitutes a constant current unit of the buffer amplifier system of the present embodiment. The constant current unit 32 has a construction similar to the current mirror unit 12 of FIG. 2. As shown in FIG. 4, the constant current unit 32 comprises an NPN transistor Q32, an NPN transistor Q33, a resistor R33, a resistor R34, and a resistor R35.

The NPN transistor Q32 constitutes a first transistor of the constant current unit of the present embodiment. The NPN transistor Q33 constitutes a second transistor of the constant current unit of the present embodiment. Each of the NPN transistors Q32 and Q33 has a base, a collector and an emitter.

In the NPN transistor Q32, the collector is connected to the emitter of the NPN transistor Q31, the emitter is grounded via the resistor R34, and the base is connected to the base of the NPN transistor Q33 via the current regulating unit 33.

In the NPN transistor Q33, the collector is connected to the source voltage terminal Tvcc via the resistor R33, the base is connected to the base of the NPN transistor Q32 via the current regulating unit 33, and the emitter is grounded via the resistor R35. Further, in the NPN transistor Q33, the collector and the base are connected to each other by a connecting wire, and the NPN transistor Q33 forms a diode. The collector of the NPN transistor Q33 and the base of the NPN transistor Q33 are set at the same voltage level by the connecting wire.

The resistor R33 is connected at one end to the source voltage terminal Tvcc, and connected at the other end to the collector of the NPN transistor Q33. Thus, current from the resistor R33 is supplied to both the collector and the base of the NPN transistor Q33.

The resistor R34 is connected at one end to the emitter of the NPN transistor Q32, and the other end of the resistor R34 is grounded. The resistor R34 serves to make stable the flow of an emitter current fed from the emitter of the NPN transistor Q32.

The resistor R35 is connected at one end to the emitter of the NPN transistor Q33, and the other end of the resistor R35 is grounded. The resistor R35 serves to make stable the flow of an emitter current fed from the emitter of the NPN transistor Q33.

Since the source voltage Vcc is supplied to the source voltage terminal Tvcc, the current from the source voltage terminal Tvcc is supplied to the base of the NPN transistor Q33 through the resistor R33 in the constant current unit 32. The NPN transistor Q33 is driven by the current fed into the base of the NPN transistor Q33, and the same current is fed into the collector of the NPN transistor Q33.

The base of the NPN transistor Q32 is connected to the base of the NPN transistor Q33 and the current regulating unit 33. When the NPN transistor Q33 is driven, the current is fed into the base of the NPN transistor Q32 through the current regulating unit 33. The current which is the same as that fed into the base of the NPN transistor Q33 is fed into the emitter of the NPN transistor Q31.

The current regulating unit 33 comprises a resistor R36, a resistor R37, a capacitor C31, and a capacitor C32.

The resistor R36 constitutes a first resistor of the current regulating unit of the present embodiment. The resistor R36 is connected at one end to the source voltage terminal Tvcc and connected at the other end to the collector of the NPN transistor Q31. Thus, with the source voltage Vcc (at the source voltage terminal Tvcc) being supplied to the resistor R36, the resistor R36 produces a collector voltage (at the connection point "c") in response to a collector current fed into the collector of the NPN transistor Q31.

As described above, the resistor R36 and the collector of the NPN transistor Q31 are connected to each other at the connection point "c". The capacitor C31 is connected at one end to the connection point "c". The other end of the capacitor C31 is connected to a connection point "d" to which the base of the NPN transistor Q32 of the constant current unit 32 is connected.

The capacitor C31 constitutes a first capacitor of the current regulating unit of the present embodiment. The capacitor C31 supplies, to the base of the NPN transistor Q32, only a signal component of the collector voltage produced at the connection point "c" in response to the collector current fed into the collector of the NPN transistor Q31.

The resistor R37 constitutes a second resistor of the current regulating unit of the present embodiment. The resistor R37 is connected at one end to the base of the NPN transistor Q32 of the constant current unit 32, and connected at the other end to the base of the NPN transistor Q33 of the constant current unit 32. The resistor R37 inhibits the supplying of the signal component of the voltage from the capacitor C31 to the base and the collector of the NPN transistor Q33. In addition, the resistor R37 prevents the attenuation of the signal component of the voltage supplied from the capacitor C31 to the base of the NPN transistor Q32.

The capacitor C32 constitutes a second capacitor of the current regulating unit of the present embodiment. The capacitor C32 is connected at one end to the base of the NPN transistor Q33 of the constant current unit 32, and the other end of the capacitor C32 is grounded. The resistor R37 and the capacitor C32 constitute a filter unit, and this filter unit serves to make stable the flow of the base current of the NPN transistor Q33 fed into the base of the NPN transistor Q32.

The buffer amplifier system 31 has an output terminal Tout. The output terminal Tout is connected to the connection point "b" at which the emitter of the NPN transistor Q31 and the collector of the NPN transistor Q32 of the constant current unit 32 are connected to each other. The buffer amplifier system 31 produces an output signal at the emitter of the NPN transistor Q31 in response to the input signal at the base of the NPN transistor Q31. The output signal from the emitter of the NPN transistor Q31 is supplied to the output terminal Tout.

In the buffer amplifier system 31, a capacitor CL is connected at one end to the output terminal Tout and connected at the other end to a load resistor RL. The capacitor CL removes a DC component of the output signal supplied to the output terminal Tout, and a current in accordance with the output signal is fed into the load resistor RL.

Figure 5:
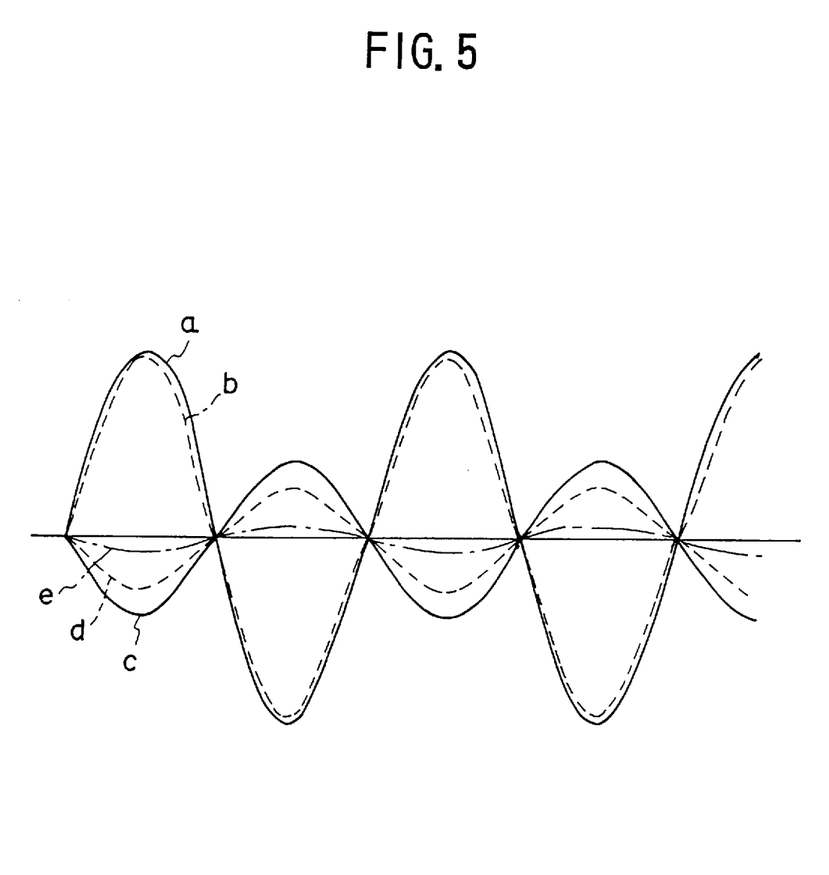
FIG. 5 is a waveform chart for explaining an operation of the buffer amplifier system of FIG. 4.

FIG. 5 is a waveform chart for explaining an operation of the buffer amplifier system of FIG. 4.

In FIG. 5, a waveform of the input signal supplied to the input terminal Tin is indicated by a solid line "a", a waveform of the output signal supplied to the output terminal Tout is indicated by a dotted line "b", a waveform of the collector voltage of the NPN transistor Q31 is indicated by a solid line "c", a waveform of the base voltage of the NPN transistor Q32 is indicated by a dotted line "d", and a waveform of the base voltage of the NPN transistor Q33 is indicated by a one-dot chain line "e".

The characters "a" through "e" in the waveform chart of FIG. 5 respectively correspond to the characters "a" through "e" which refer to the connection points in the circuit diagram of FIG. 4.

As described above, the input signal "a" supplied to the input terminal Tin is supplied to the base of the NPN transistor Q31 through the capacitor C30. With the input signal "a" being supplied, the emitter current of the NPN transistor Q31 is capable of driving the load resistor RL to an adequately high voltage level.

When the voltage of the input signal "a" is positive, a collector voltage at the collector (which the first resistor R36 is connected to) of the NPN transistor Q31 is produced as indicated by the solid line "c" in FIG. 5. As shown in FIG. 5, the phase of the collector voltage "c" is reverse to the phase of the voltage of the input signal "a".

The collector voltage "c" of the NPN transistor Q31 at this time is supplied to the base of the NPN transistor Q32 through the first capacitor C31. Since the base voltage "d" of the NPN transistor Q32 is driven to a negative voltage side, the collector current fed into the collector of the NPN transistor Q32 is reduced. Thus, when the voltage of the input signal "a" is positive, the current regulating unit 33 increases the drive capability of the emitter follower unit.

When the voltage of the input signal "a" changes to a negative voltage level, the collector voltage "c" at the collector (which the first resistor R36 is connected to) of the NPN transistor Q31 is increased. As shown in FIG. 5, the phase of the collector voltage "c" is reverse to the phase of the voltage of the input signal "a".

The collector voltage "c" of the NPN transistor Q31 at this time is supplied to the base of the NPN transistor Q32 through the first capacitor C31. Since the base voltage "d" of the NPN transistor Q32 is driven to a positive voltage side, the collector current fed into the collector of the NPN transistor Q32 is increased. Thus, when the voltage of the input signal "a" is negative, the current regulating unit 33 increases the sink capability of the emitter follower unit. The emitter current of the NPN transistor Q31 is capable of adequately driving the load resistor RL to a negative voltage side.

In the buffer amplifier system 31 of the present embodiment, the constant current unit 32 utilizes the construction similar to the current mirror unit 12 of FIG. 2. The constant current unit 32 produces a constant current in response to the source voltage Vcc from the source voltage terminal Tvcc, the constant current being fed from the emitter of the NPN transistor Q31 into the collector of the NPN transistor Q32. By using the constant current unit 32, the buffer amplifier system 31 can produce an adequately high level of the output signal in response to the input signal when the amplifier system 31 operates with a low voltage level and a small current consumption.

In the buffer amplifier system 31 of the present embodiment, the resistor R37 and the capacitor C32 constitute a filter unit of the current regulating unit 33. The filtering effect of the resistor R37 and the capacitor C32 prevents the base voltage "e" of the NPN transistor Q33 of the constant current unit 32 from being excessively increased. Thus, the constant current characteristic of the constant current unit 32 is made stable by the current regulating unit 33.

In the buffer amplifier system 31 of the present embodiment, the current regulating unit 33 regulates the constant current, produced by the constant current unit 32, in response to the collector current fed into the collector of the NPN transistor Q31, and the constant current is fed from the emitter of the NPN transistor Q31 into the collector of the NPN transistor Q32. As described above, the phase of the collector current at the connection point "c" is reverse to the phase of the input signal at the connection point "a". The current regulating unit 33 regulates the constant current in response to the collector current "c" the phase of which is reverse to the phase of the input signal "a". It is possible that the drive capability of the emitter follower unit be increased with a small current consumption.

In the buffer amplifier system 31 of the present embodiment, the current regulating unit 33 regulates the base voltage "e" at the base of the second transistor Q33 of the constant current unit 32 in response to the collector current fed into the collector of the emitter follower unit. Therefore, the current regulating unit 33 can regulate the constant current in response to the collector current "c" the phase of which is reverse to the phase of the input signal "a", and the regulated constant current is fed from the emitter of the NPN transistor Q31 into the collector of the NPN transistor Q32. It is possible that the drive capability of the emitter follower unit be increased with a small current consumption.

In the buffer amplifier system 31 of the present embodiment, the current regulating unit 33 comprises the first resistor R36 and the first capacitor C31. The first resistor R36 changes the source voltage Vcc to the collector voltage in response to the collector current fed into the collector of the NPN transistor Q31. The first capacitor C31 supplies, to the base of the NPN transistor Q32, the signal component of the collector voltage produced at the connection point "c" in response to the collector current fed into the collector of the NPN transistor Q31. Since the constant current is fed from the emitter of the NPN transistor Q31 into the collector of the NPN transistor Q32, the constant current unit 32 for producing the constant current is effectively driven by the current regulating unit 33. It is possible that the drive capability of the emitter follower unit be increased with a small current consumption.

In the buffer amplifier system 31 of the present embodiment, the current regulating unit 33 further comprises the second resistor R37. The second resistor R37 inhibits the supplying of the signal component of the voltage from the capacitor C21 to the base and the collector of the NPN transistor Q33. In addition, the second resistor R37 prevents the attenuation of the signal component of the voltage supplied from the capacitor C31 to the base of the NPN transistor Q32. It is possible that the current regulating unit 33 effectively drive the NPN transistor Q32 of the constant current unit 32.

In the buffer amplifier system 31 of the present embodiment, the current regulating unit 33 further comprises the second capacitor C32. The second capacitor C32 and the second resistor R37 constitute a filter unit, and the filtering effect of the second capacitor C32 and the second resistor R37 makes stable the flow of the base current of the NPN transistor Q33 fed into the base of the NPN transistor Q32. The current regulating unit 33 can stably supply the base current from the second transistor Q33 to the first transistor Q32, and it is possible that the constant current is stably fed from the emitter of the emitter follower unit into the collector of the first transistor Q32.

Figure 6:
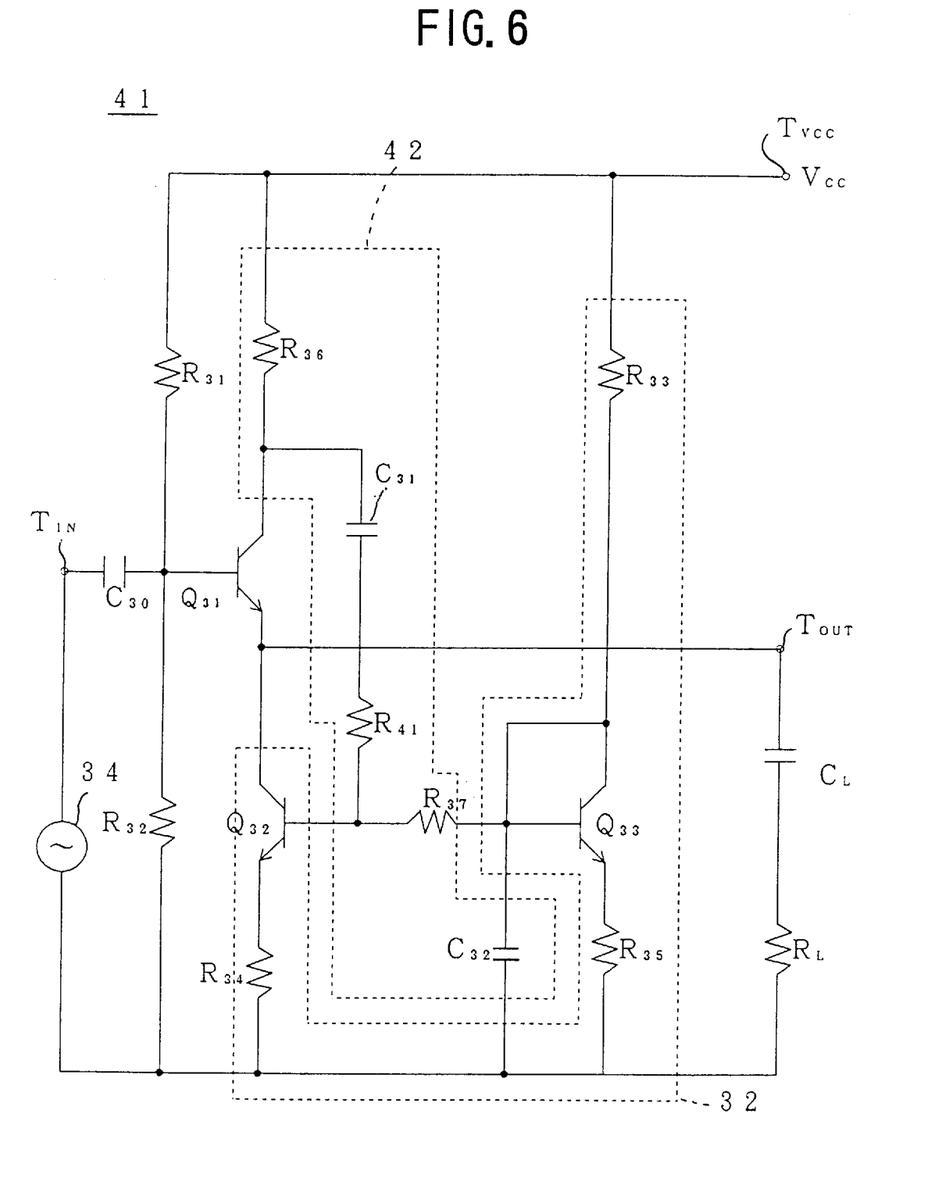
FIG. 6 is a circuit diagram showing a modification of the buffer amplifier system of FIG. 4.

FIG. 6 shows a modification of the buffer amplifier system of FIG. 4. In FIG. 6, the elements which are the same as corresponding elements in FIG. 4 are designated by the same reference numerals, and a description thereof will be omitted.

As shown in FIG. 6, a buffer amplifier system 41 comprises a current regulating unit 42 which is different from the current regulating unit 33 of the buffer amplifier system 31 in FIG. 4. In addition to all the elements of the current regulating unit 33, the current regulating unit 42 further includes a resistor R41 which is connected at one end to the capacitor C31 and connected at the other end to the base of the first transistor Q32 of the constant current unit 32.

The resistor R41 constitutes a third resistor of the current regulating unit of the present embodiment. The resistor R41 has a resistance which is varied to adjust the output signal produced at the emitter of the NPN transistor Q31. The resistor R41 adjusts the amount of the signal component of the collector voltage "c" supplied to the base of the NPN transistor Q32 of the constant current unit 32.

For example, when it is desired to increase the amplitude of the output signal supplied to the output terminal Tout, the resistance of the resistor R41 is varied to a small resistance. By using such resistor R41 in the buffer amplifier system 41, the amplitude of the output signal produced at the emitter of the NPN transistor Q31 can be easily increased.

On the other hand, when it is desired to reduce the amplitude of the output signal, the resistance of the resistor R41 is varied to a large resistance. By using such resistor R41 in the buffer amplifier system 41, the amplitude of the output signal produced at the emitter of the NPN transistor Q31 can be easily reduced.

In the buffer amplifier system 41 of the present embodiment, the frequency characteristic and the drive capability of the emitter follower unit can be easily adjusted by using the resistor R41.

In the above-described embodiments of FIGS. 4 and 6, a single transistor is used for each of the NPN transistors Q31, Q32 and Q33. When it is desired to obtain a greater ratio of current amplification of the buffer amplifier system, a Darlington circuit including two transistors for each of the NPN transistors Q31, Q32 and Q33 may be used instead.

In the above-described embodiments of FIGS. 4 and 6, an NPN transistor is used for each of the NPN transistors Q31, Q32 and Q33. Alternatively, a PNP transistor may be used for each of the NPN transistors Q31, Q32 and Q33. It is a matter of course that the advantages and effects which are the same as those of the above-described embodiments can be also obtained in the alternative.

Further, the present invention is not limited to the above-described embodiments, and variations and modifications may be made without departing from the scope of the present invention.

What is claimed is:

1. An amplifier system comprising:

a constant current unit for producing a constant current in response to a source voltage from a source voltage terminal;

an emitter follower unit having a base, an emitter and a collector, an input signal being supplied to said base, said emitter being connected to the constant current unit, the source voltage being supplied to said collector, said emitter follower unit producing an output signal at said emitter in response to the input signal;

a current regulating unit for regulating the constant current in response to a collector current fed into the collector of the emitter follower unit, so that said constant current is fed from the emitter of the emitter follower unit into the constant current unit; wherein said current regulating unit comprises a first resistor, a first capacitor, and a second resistor with said first resistor being connected at one end to the source voltage terminal and connected at the other end to the collector of the emitter follower unit, said first capacitor being connected at one end to a connection point at which the first resistor and the collector of the emitter follower unit are connected to each other, the other end of the first capacitor being connected to the constant current unit, and with said second resistor being connected at one end to a connection point at which the constant current unit and the first capacitor are connected to each other, said second resistor being connected at the other end to the constant current unit; and wherein said current regulating unit further comprises a second capacitor, said second capacitor being connected at one end to a connection point at which the constant current unit and the second resistor are connected to each other, the other end of the second capacitor being grounded.

2. An amplifier system comprising:

a constant current unit for producing a constant current in response to a source voltage from a source voltage terminal;

an emitter follower unit having a base, an emitter and a collector, an input signal being supplied to said base, said emitter being connected to the constant current unit, the source voltage being supplied to said collector, said emitter follower unit producing an output signal at said emitter in response to the input signal;

a current regulating unit for regulating the constant current in response to a collector current fed into the collector of the emitter follower unit, so that said constant current is fed from the emitter of the emitter follower unit into the constant current unit; wherein said current regulating unit comprises a first resistor and a first capacitor, said first resistor being connected at one end to the source voltage terminal and connected at the other end to the collector of the emitter follower unit, said first capacitor being connected at one end to a connection point at which the first resistor and the collector of the emitter follower unit are connected to each other, the other end of the first capacitor being connected to the constant current unit; and wherein said current regulating unit further comprises a resistor provided between the first capacitor and the constant current unit, said resistor having a resistance which is varied to adjust the output signal.

3. An amplifier system comprising:

a constant current unit for producing a constant current in response to a source voltage from a source voltage terminal;

an emitter follower unit having a base, an emitter and a collector, an input signal being supplied to said base, said emitter being connected to the constant current unit, the source voltage being supplied to said collector, said emitter follower unit producing an output signal at said emitter in response to the input signal;

a current regulating unit for regulating the constant current in response to a collector current fed into the collector of the emitter follower unit, so that said constant current is fed from the emitter of the emitter follower unit into the constant current unit; wherein said constant current unit comprises a first transistor and a second transistor, said first transistor having a base and a collector connected to the emitter of the emitter follower unit, a current from the emitter of the emitter follower unit being fed into the collector of the first transistor, said second transistor having a base connected to the base of the first transistor and a collector connected to the source voltage terminal, said current regulating unit regulating a base voltage at the base of the second transistor in response to the collector current fed into the collector of the emitter follower unit and wherein said current regulating unit comprises a first resistor and a first capacitor, said first resistor being connected at one end to the source voltage terminal and connected at the other end to the collector of the emitter follower unit, said first capacitor being connected at one end to a connection point at which the first resistor and the collector of the emitter follower unit are connected to each other, the other end of the first capacitor being connected to the base of the first transistor.

4. The amplifier system according to claim 3, wherein said current regulating unit further comprises a second resistor, said second resistor being connected at one end to a connection point at which the base of the first transistor and the first capacitor are connected to each other, said second resistor being connected at the other end to the base of the second transistor.

5. The amplifier system according to claim 4, wherein said current regulating unit further comprises a second capacitor, said second capacitor being connected at one end to a connection point at which the base of the second transistor and the second resistor are connected to each other, the other end of the second capacitor being grounded.

6. The amplifier system according to claim 5, wherein said current regulating unit further comprises a third resistor provided between the first capacitor and the base of the first transistor, said third resistor having a resistance which is varied to adjust the output signal.

* * * * *